United States Patent
Van Der Meer et al.

(10) Patent No.: US 6,177,314 B1
(45) Date of Patent: Jan. 23, 2001

(54) METHOD OF MANUFACTURING A SEMICONDUCTOR DEVICE COMPRISING A FIELD EFFECT TRANSISTOR

(75) Inventors: Hendrik H. Van Der Meer; Klaas G. Druijf; Adrianus C. L. Heessels, all of Nijmegen (NL)

(73) Assignee: U.S. Philips Corporation, New York, NY (US)

(*) Notice: Under 35 U.S.C. 154(b), the term of this patent shall be extended for 0 days.

(21) Appl. No.: 09/561,509

(22) Filed: Apr. 27, 2000

(30) Foreign Application Priority Data

Apr. 28, 1999 (EP) ................................. 99201329

(51) Int. Cl.[7] ................... H01L 21/3205; H01L 21/4763
(52) U.S. Cl. ..................... 438/257; 438/302; 438/306; 438/682
(58) Field of Search ................................ 438/302, 303, 438/306, 682, 683, 299, 257; 257/280

(56) References Cited

U.S. PATENT DOCUMENTS

| | | | |
|---|---|---|---|
| 5,508,539 | * 4/1996 | Gilbert et al. | 257/280 |
| 5,753,557 | 5/1998 | Tseng | 438/303 |
| 5,891,774 | * 4/1999 | Ueda et al. | 438/264 |
| 6,074,900 | * 6/2000 | Yamazaki et al. | 438/164 |

* cited by examiner

*Primary Examiner*—Olik Chaudhuri
*Assistant Examiner*—Theresa T. Doan
(74) *Attorney, Agent, or Firm*—Steven R. Biren

(57) ABSTRACT

Known salicide processes have the disadvantage that they may cause a short circuit between silicide contacts on source and drain regions, on the one hand, and the silicide contact on the poly gate, on the other hand, which is commonly referred to as bridging. The invention provides a simple and self-aligned method of avoiding this type of short-circuit. After the gate definition, a titled source/drain implantation (9) is carried out, while the resist mask (7) is held in place, the angle and the implantation energy being chosen such that ions impinging on the resist mask are scattered at a small angle with respect to the silicon surface. Apart from the gate, small areas (12b, 13b) are obtained thereby, which are more heavily doped than adjacent areas (12a, 13a) of the source/drain regions. Subsequently, a thermal oxide layer is grown having thicker portions (15) on top of the more heavily doped regions, and thinner portions (14) on top of the more lightly doped regions. By removing the thinner oxide portions (14), spacers (15) are obtained which provide for a separation between the silicide contacts (22, 23) of the source/drain regions and the silicide contact (24) of the gate. The invention provides special advantages in the field of manufacturing non-volatile memories.

5 Claims, 3 Drawing Sheets

METHOD OF MANUFACTURING A SEMICONDUCTOR DEVICE COMPRISING A FIELD EFFECT TRANSISTOR

BACKGROUND OF THE INVENTION

The invention relates to a method of manufacturing a semiconductor device comprising a semiconductor body of silicon which is provided at a surface with a field effect transistor with an isolated gate electrode, which surface is covered with a gate-dielectric layer on which a silicon layer is deposited, whereon an etch mask is formed which defines the gate electrode, whereafter the gate electrode is formed from the silicon layer by means of etching, after which doped regions are provided next to the gate electrode by implanting ions at the surface of the semiconductor body, which regions form a source region and a drain region of the transistor, whereafter, in a next step, a metal layer is applied which forms a contact with the source and drain regions in the semiconductor body and with an upper surface of the gate electrode and which is separated from the side walls of the gate electrode by an intermediate electrically insulating layer covering the side walls of the gate electrode, whereafter, by means of heating, metal silicide contacts are formed at locations where the metal layer contacts silicon and, subsequently, non-converted parts of the metal layer are removed by selective etching.

Such a method is disclosed, inter alia, in the patent document U.S. Pat. No. 5,753,557. In the manufacture of integrated circuits, the source and drain regions formed, as well as the gate electrode, are customarily provided with low-impedance contacts of a metal-silicon alloy, hereinafter referred to as silicide. The provision of these silicide contacts customarily takes place in a self-aligning manner by depositing a suitable metal, such as Ti, throughout the surface and subsequently carrying out a heating step. At the location where the Ti directly contacts the silicon, such as on the source and drain regions of the transistors and on the gate electrodes which are customarily made of doped polysilicon, the titanium is converted to silicide. At the location where titanium does not contact silicon, such as above field oxide or above groove-isolations, and on the spacer-covered side faces of the gate electrodes, the titanium is not converted. The unconverted titanium can be removed in a selective etching step. In practice it has been found that this often leads to a short-circuit between the source region and/or the drain region, on the one hand, and the gate electrode, on the other hand, via a connection along the spacers. In the literature, this phenomenon is often referred to as "bridging". To preclude this short-circuit, it has already been proposed in the above-mentioned patent document U.S. Pat. No. 5,753,557 to extend the spacers on the gate electrode as far as the upper surface of the gate electrode, so that the distance between the silicide contacts is increased. A drawback of this method is, inter alia, that the contact on the gate electrode is reduced in size and hence the input resistance of the transistor is increased. In addition, this method requires a rather critical etching step to obtain the mask defining the contact on the gate electrode.

SUMMARY OF THE INVENTION

It is an object of the invention to provide, inter alia, a method wherein "bridging" is precluded without it causing an increase of contact resistances and without introducing additional critical process steps. To achieve this, a method of the type mentioned in the opening paragraph is characterized in accordance with the invention in that the implantation of ions is carried out in the presence of the etch mask on the gate electrode and at an angle with the normal to the surface such that ions incident on a side wall of the etch mask are scattered towards the surface of the semiconductor body and form sub-regions in the source and drain regions next to the gate electrode, which sub-regions have a higher doping level than parts of the source and drain regions which are situated at a greater distance from the gate electrode, whereafter, by means of thermal oxidation, an oxide layer is formed on the source and drain regions, which oxide layer has a greater thickness on the sub-regions than on the above-mentioned more distant parts of the source and drain regions, after which an etching step is subsequently carried out wherein the oxide layer on said more remote parts of the source and drain regions is entirely removed and the oxide layer on said sub-regions is removed only over a part of the thickness, so that an oxide layer remains above the sub-regions, and in a subsequent step, the metal layer is provided which, on said more remote parts, makes contact with the surface of the semiconductor body and, at the location of said sub-regions, is separated from the surface by the oxide layer. The invention makes use of the phenomenon, which is known per se, that in the case of oxidation of silicon, the oxidation rate increases with the doping concentration. As a result of ion scattering at the mask, the doping concentration in small areas close to the gate electrode is additionally increased, so that, in the case of oxidation, a thicker oxide grows above these areas, which forms an additional spacer during the silicidation process. These spacers are obtained in a simple and self-aligning manner without additional critical process steps.

Favorable embodiments of a method in accordance with the invention are described in the dependent claims.

These and other aspects of the invention will be apparent from and elucidated with reference to the embodiments described hereinafter.

DESCRIPTION OF THE PREFERRED EMBODIMENTS

Hereinbelow, a description will be given of a method in accordance with the invention for manufacturing, by way of example, a non-volatile memory cell comprising an n-channel field effect transistor with a floating gate. Obviously, a method in accordance with the invention can also be used to manufacture ordinary n-channel transistors or p-channel field effect transistors as well integrated circuits comprising transistors of both conductivity types. It is further noted that, predominantly, process steps are described which are specific to the invention. Customary process steps, such as anti-punch-through implantation, which are not essential to the invention but which are standard process steps are not described.

Figure 1:
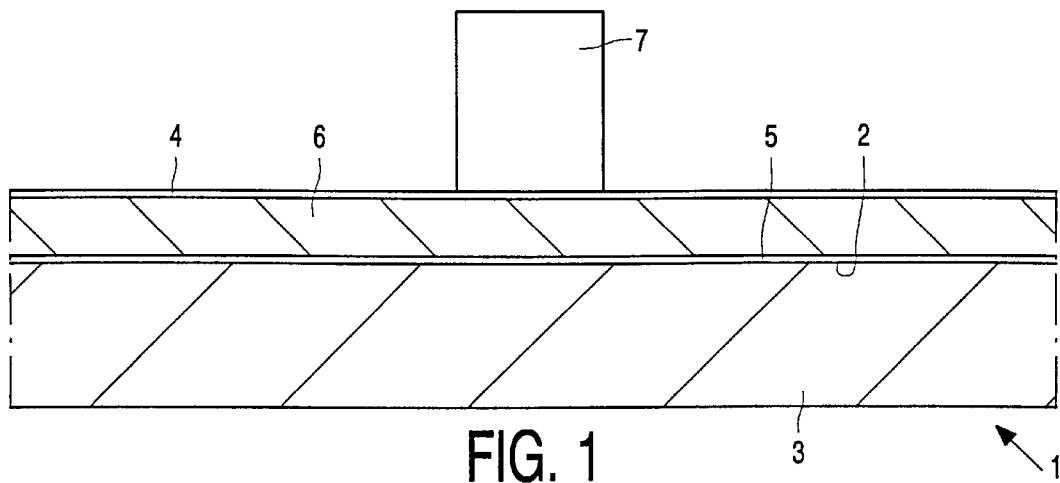
FIGS. 1–8 show a sectional view of a field effect transistor manufactured using a method in accordance with the invention, at different stages in the manufacturing process.

There is started from a semiconductor body 1 of silicon comprising a surface region 3 of a first conductivity type, in this example the p-type, which surface region is adjacent to a surface 2. In the surface region 3, an active region is defined in a customary manner, for example, by thick field oxide, not shown in the drawing, along the circumference of the active region. It is alternatively possible, of course, to apply groove isolation along the circumference of the active region. The surface 2 of the active region is covered, for example by means of thermal oxidation, with an oxide layer 5 having a thickness of, for example 11 nm, which forms the gate dielectric of the floating gate-MOS transistor to be formed. On this oxide layer there is provided, in a customary manner, a polycrystalline or amorphous silicon layer 6 having a thickness, for example, of 0.2 µm which is p-doped in situ, or at a later stage. On the layer 6 there is formed a mask of a photoresist layer 7 which defines the floating gate electrode of the MOS transistor. The mask 7 may be formed directly on the layer 6. Preferably, however, the layer 6 is first provided with a layer 4 of silicon oxide or silicon oxynitride after which the mask 7 is formed on the layer 4. FIG. 1 shows the device at this stage of the manufacturing process.

Figure 2:
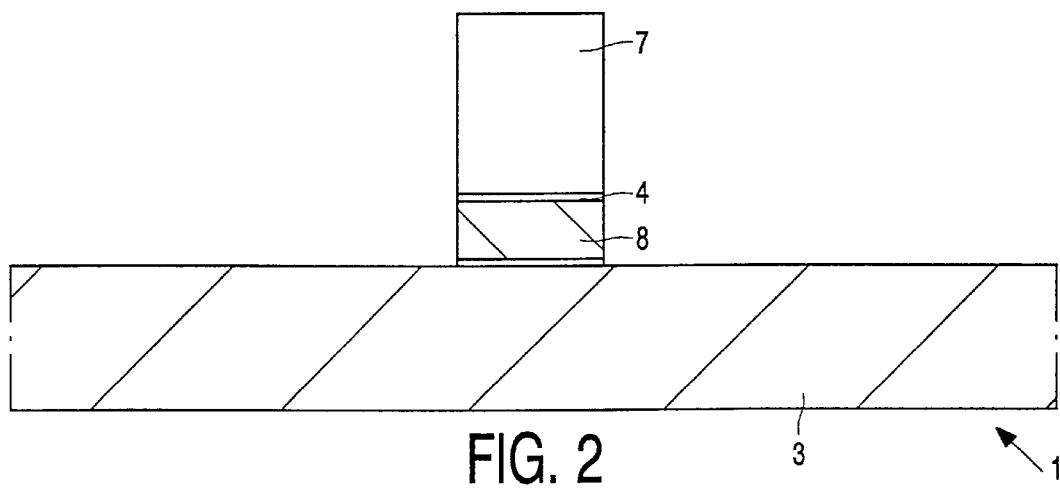

The unmasked parts of the layer 4 and of the layer 6 (hereinafter referred to as poly layer for short) are removed in a customary manner by etching, thereby forming the floating gate or gate electrode 8 (FIG. 2). The uncovered parts of the oxide layer 5 can also be removed, as shown in FIG. 2, but this is not necessary. If desired, these parts of the oxide layer 5 may be removed at a later stage. Unlike most customary processes, the mask 7 is not removed yet.

Figure 3:
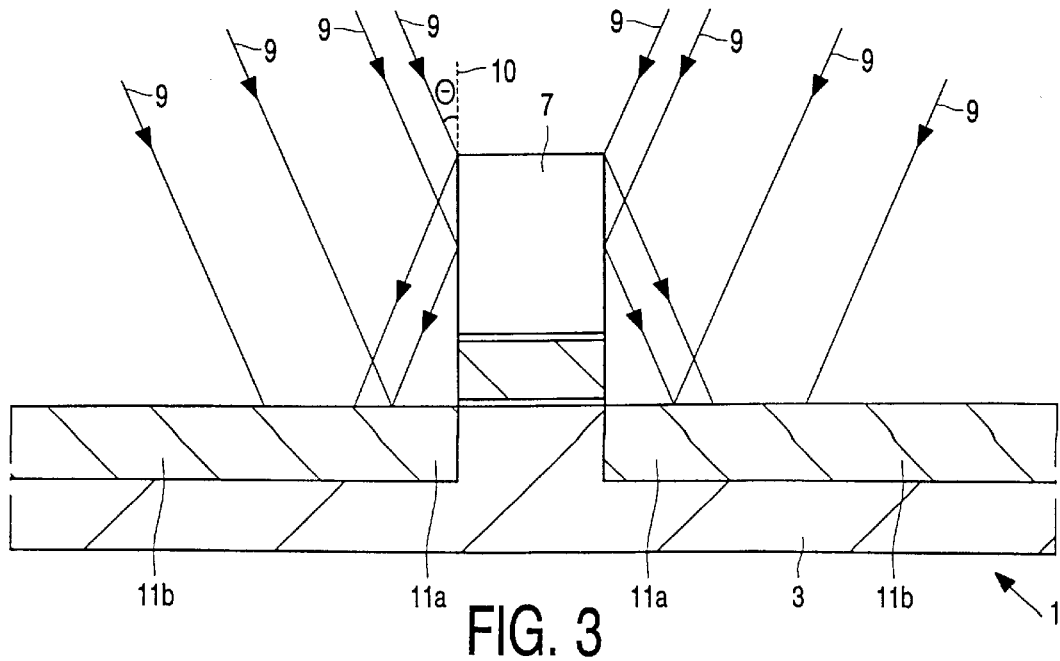

At a next stage, see FIG. 3, As ions are implanted, which is indicated by lines 9. The ions are implanted at an angle θ, in this example 7 degrees, with the normal 10 to the surface. The implantation energy is, for example, 60 KeV. It has been found that under these conditions, the As ions incident on the mask 7 are scattered in the direction of the surface 2. In the regions 11a adjoining the floating gate 8, not only As ions are directly implanted, as is the case in the adjoining regions 11b, but also the ions which are scattered by the mask 7. As a result, the regions 11a attain a higher doping concentration than the regions 11b of the transistor's source and drain regions to be formed. After the implantation, the mask 7 is removed.

Figure 4:
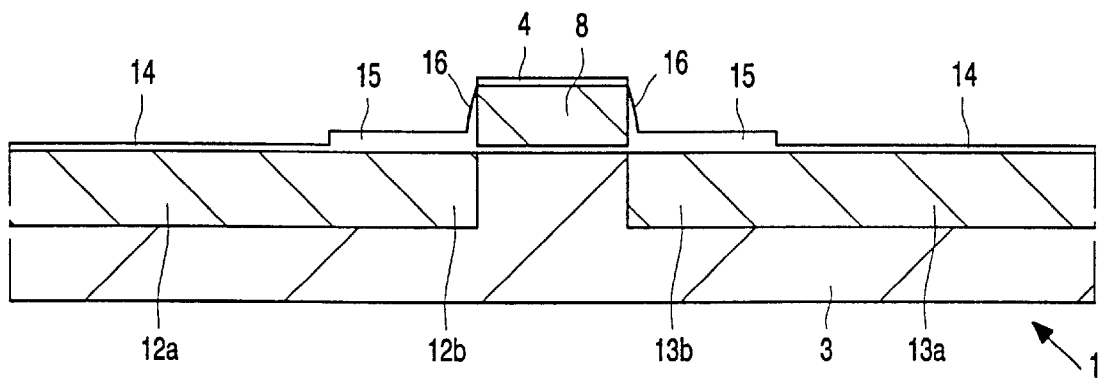
Figure 5:
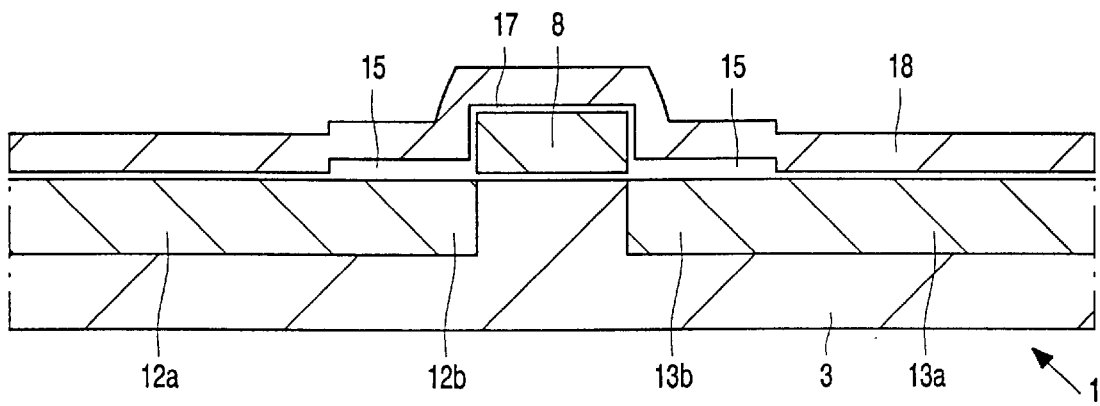

In a subsequent step, the temperature is increased to approximately 800° C. in an oxidizing environment for 10 minutes. A silicon oxide layer is formed in a non-uniform thickness on the surface of the silicon body, said silicon oxide layer being a relatively thin layer 14 having a thickness of 40 nm which is formed above the less heavily doped regions 12a and 13a of, respectively, the source region and the drain region, and a relatively thick layer 15 having a thickness of approximately 80 nm which is formed above the more heavily doped regions 12b and 13b of the source and drain regions (FIG. 4). At the same time, an oxide layer 16 is formed on the side faces of the poly gate 8. The upper surface of the gate 8 is masked against oxidation by the oxynitride layer 4 which can be selectively removed after the oxidation step. By means of anisotropic etching, the relatively thin oxide 14 above the sub-regions 12a and 13a is removed. By virtue of the differences in thickness between the oxide layers 14, 15, the etch step can be carried out in such a way that the more heavily doped regions 12b and 13b remain covered with oxide 15. Subsequently, the floating gate 8 is covered with a thin interpoly dielectric 17, which is formed, for example, by an oxide-nitrideoxide layer. The whole is covered with a second poly layer 18 and subsequently doped. FIG. 5 shows this stage of the process.

Figure 6:
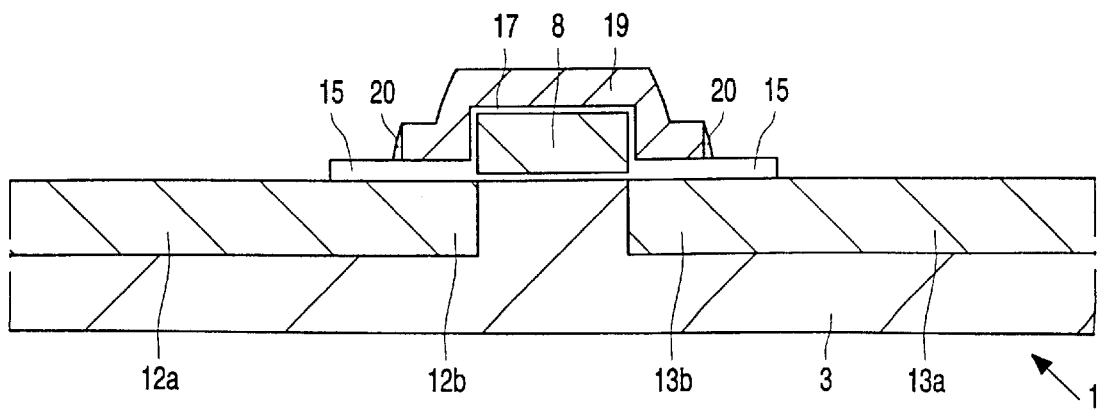

In a customary manner, the poly layer 18 is provided with a pattern to obtain the control gate 19. The side walls of the control gate are provided with oxide spacers 20. The oxide above the regions 12a and 13a is removed, while the regions 12b and 13b remain covered with the oxide 15 (FIG. 6).

Figure 7:
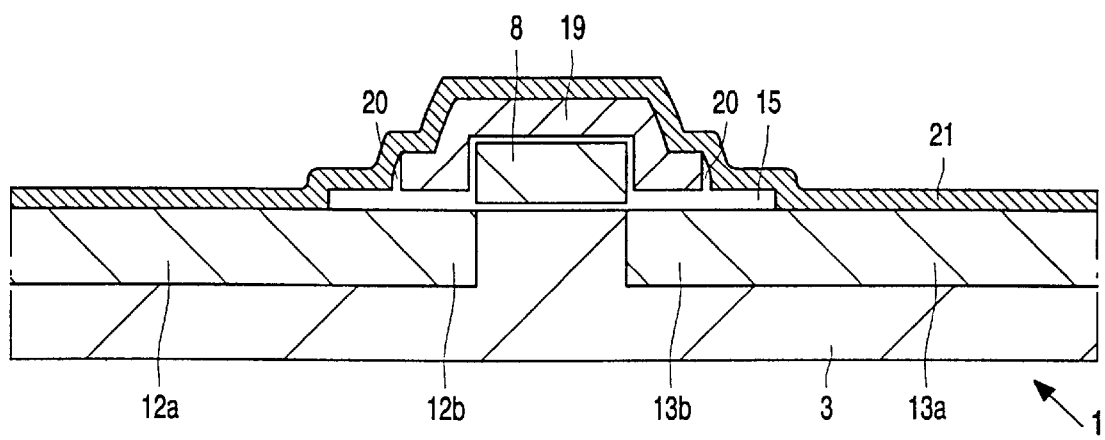
Figure 8:
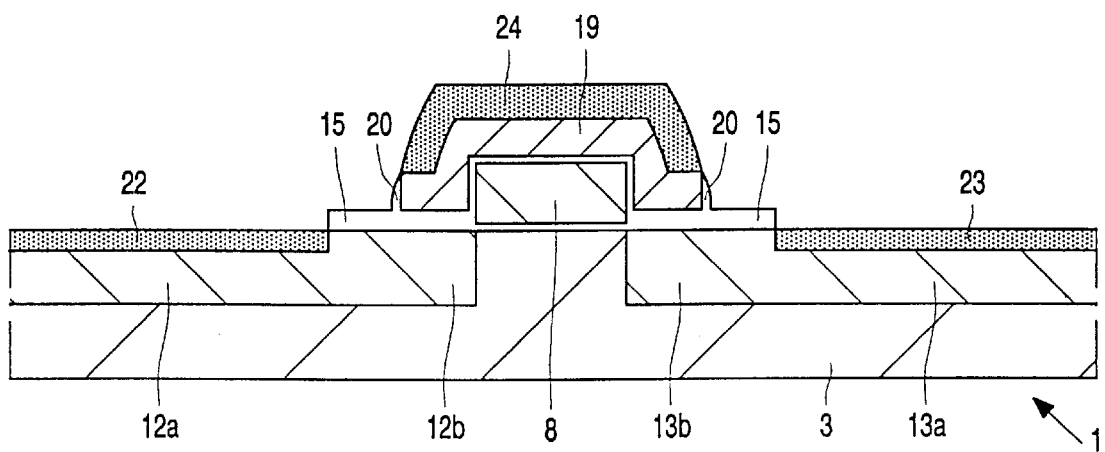

In a next step (FIG. 7), a metal layer 21, for example Ti, is deposited in a thickness of, for example, approximately 30 nm. That layer 21 predominantly contacts the regions 12a and 13a of the source and drain regions and the upper surface of the control gate 19, and is separated from the regions 12b and 13b next to the gate electrode 8 by the oxide layers 15 and from the side walls of the control gate 19 by the spacers 20. By heating at a temperature of, for example, 700° C., titanium contacting silicon is converted to a titanium silicide alloy, while the remaining titanium contacting silicon oxide does not form an alloy. By selective etching, the non-alloyed titanium can be removed, which results in the stage shown in FIG. 8. The source region 12 and the drain region 13 are provided with a silicide contact 22 and 23, respectively, which predominantly extend above the regions 12a and 13a, respectively, which are situated at a distance from the gate electrode. The control gate 19 is also provided with a silicide contact 24 which extends transversely across the width of the gate electrode. A short-circuit between the silicide contacts 22 and 23, on the one hand, and the silicide contact 24, on the other hand, is precluded by the presence of the oxide layers 15 which are entirely obtained in a self-aligning manner.

As will be obvious from the foregoing, the width of the regions 12b and 13b, and hence of the oxide layers 15, can be adjusted by means of, inter alia, the implantation angle θ, the thickness of the photoresist layer 7 and the poly layer 6, and by means of the energy and type of the implanted ions. It has been found that, at an implantation angle of 7 degrees, and at customary thicknesses of the poly layer (approximately 250 nm) and of the photoresist layer 7 (approximately 1.35 µm), oxide layers having a width of approximately 300 nm can be obtained.

Hereinabove, the invention has been explained by means of a non-volatile memory cell. It will be obvious that the invention can also be readily used for manufacturing a MOS transistor which, being an active circuit element, forms part of an electronic circuit.

It will also be obvious that many variations are possible to those skilled in the art. For example, the width of the oxide spacers 15 can be adjusted within certain limits by means of the height of the photoresist layer 7, the implantation angle θ, the implantation energy and the impurity used. The method cannot only be used for the manufacture of n-channel transistors but also for the manufacture of p-channel transistors.

What is claimed is:

1. A method of manufacturing a semiconductor device comprising a semiconductor body of silicon which is provided at a surface with a field effect transistor with an insulated gate electrode, which surface is covered with a gate-dielectric layer on which a silicon layer is deposited, whereon an etch mask is formed which defines the gate electrode, whereafter the gate electrode is formed from the silicon layer by means of etching, after which doped regions are provided next to the gate electrode by implanting ions at the surface of the semiconductor body, which regions form a source region and a drain region of the transistor, whereafter, in a next step, a metal layer is applied which forms a contact with the source and drain regions in the semiconductor body and with an upper surface of the gate electrode and which is separated from the side walls of the gate electrode by an intermediate electrically insulating layer covering the side walls of the gate electrode, whereafter, by means of heating, metal silicide contacts are formed at locations where the metal layer contacts silicon and, subsequently, non-converted parts of the metal layer are removed by selective etching, characterized in that the implantation of ions is carried out in the presence of the etch mask on the gate electrode and at an angle with the normal to the surface such that ions incident on a side wall of the etch mask are scattered towards the surface of the semiconductor body and form sub-regions in the source and drain regions next to the gate electrode, which sub-regions have a higher doping level than parts of the source and drain regions which are situated at a greater distance from the gate electrode, whereafter, by means of thermal oxidation, an oxide layer is formed on the source and drain regions, which oxide layer has a greater thickness on the sub-regions than on the above-mentioned more distant parts of the source and drain regions, after which an etching step is subsequently carried out wherein the oxide layer on said more remote parts of the source and drain regions is entirely removed and the oxide layer on said sub-regions is removed only over a part of the thickness, so that an oxide layer remains above the sub-regions, and in a subsequent step, the metal layer is provided which, on said more remote parts, makes contact with the surface of the semiconductor body and, at the location of said sub-regions, is separated from the surface by the oxide layer.

2. A method as claimed in claim 1, characterized in that the angle between the normal and the implantation direction is equal, or at least substantially equal, to 7 degrees.

3. A method as claimed in claim 1, characterized in that the etch mask is formed by a photoresist layer having a thickness which is equal, or substantially equal, to 2 $\mu$m.

4. A method as claimed in claim 1, characterized in that the ions are formed by As ions.

5. A method as claimed in claim 1, characterized in that the gate electrode is provided as a floating gate of a non-volatile memory element in the form of a field-effect transistor having a floating gate.

* * * * *